United States Patent
Lin et al.

(10) Patent No.: US 11,538,752 B2
(45) Date of Patent: Dec. 27, 2022

(54) CONTACT AREA STRUCTURE WITH ORGANIC ADHESIVE LAYER BETWEEN INORGANIC CONDUCTIVE LAYER AND TRANSPARENT CONDUCTIVE LAYER

(71) Applicant: TPK Advanced Solutions Inc., Fujian (CN)

(72) Inventors: Chia-Jui Lin, Taoyuan County (TW); Kuo-Lung Fang, Hsinchu County (TW); Jun-Rong Chen, Zhubei (TW); Cheng-Jun Yang, Kaili (CN)

(73) Assignee: TPK Advanced Solutions Inc., Fujian (CN)

( * ) Notice: Subject to any disclaimer, the term of this patent is extended or adjusted under 35 U.S.C. 154(b) by 136 days.

(21) Appl. No.: 17/094,631

(22) Filed: Nov. 10, 2020

(65) Prior Publication Data
US 2022/0148960 A1  May 12, 2022

(51) Int. Cl.
*H01L 23/528* (2006.01)
*H01L 23/532* (2006.01)
*H01L 23/14* (2006.01)

(52) U.S. Cl.
CPC .......... *H01L 23/528* (2013.01); *H01L 23/145* (2013.01); *H01L 23/53228* (2013.01)

(58) Field of Classification Search
CPC .................................................... H01L 23/528
USPC ........................................................ 257/762
See application file for complete search history.

(56) References Cited

U.S. PATENT DOCUMENTS

| 2012/0287068 A1* | 11/2012 | Colgate ............... G06F 3/045 345/173 |
| 2014/0118280 A1* | 5/2014 | Chang ............... G06F 3/0445 345/173 |
| 2020/0287159 A1* | 9/2020 | Lee ..................... H01L 27/3276 |

FOREIGN PATENT DOCUMENTS

| EP | 3547093 A1 | 10/2019 |
| TW | I494820 B | 8/2015 |
| TW | I602200 B | 10/2017 |
| TW | I618756 B | 3/2018 |
| TW | M607546 U | 2/2021 |

* cited by examiner

*Primary Examiner* — Ajay Arora
(74) *Attorney, Agent, or Firm* — Cooper Legal Group, LLC

(57) ABSTRACT

A contact area structure including an organic substrate, an inorganic conductive layer, an organic adhesive layer, and a transparent conductive layer is provided. The organic substrate includes at least one contact pad area including a first block and a second block adjacent to the first block. The inorganic conductive layer is disposed on the organic substrate, in which the inorganic conductive layer is partially disposed on the first block, and a portion of an upper surface of the organic substrate is exposed at the second block. The inorganic conductive layer and the upper surface of the organic substrate are covered by the organic adhesive layer. The transparent conductive layer is disposed on the organic adhesive layer, so that the adhesive strength between the transparent layer and the inorganic conductive layer can be enhanced.

15 Claims, 3 Drawing Sheets

CONTACT AREA STRUCTURE WITH ORGANIC ADHESIVE LAYER BETWEEN INORGANIC CONDUCTIVE LAYER AND TRANSPARENT CONDUCTIVE LAYER

BACKGROUND

Field of Disclosure

The present disclosure relates to a contact area structure. More particularly, the present disclosure relates to organic and inorganic conductors in the contact area structure.

Description of Related Art

In the prior art, the material of the transmission line is mostly a solid metal layer, and the touch electrode uses an organic material to adhere to the transmission line in the contact area at the intersection of the touch electrode and the transmission line. Thus, the larger the contact area, the smaller the contact resistance. However, organic materials cannot form chemical bonds with inorganic materials such as metals, resulting in poor adhesion and causing the touch electrodes to peel off. Therefore, the existing technology needs to be improved.

SUMMARY

The purpose of an embodiment of the present disclosure is to provide a contact area structure, which significantly enhances the adhesion of the transparent conductive layer to the inorganic conductive layer and avoids peeling because of the photoresist stripping.

The present disclosure provides a contact area structure including an organic substrate, an inorganic conductive layer, an organic adhesive layer, and a transparent conductive layer. The organic substrate includes at least one contact pad area, and the at least one contact pad area includes a first block and a second block adjacent to the first block. The inorganic conductive layer is disposed on the organic substrate, in which the inorganic conductive layer is partially disposed on the first block, and a portion of an upper surface of the organic substrate is exposed at the second block. The organic adhesive layer covers the inorganic conductive layer and the upper surface of the organic substrate. The transparent conductive layer is disposed on the organic adhesive layer.

In some embodiments, the inorganic conductive layer is a metal layer.

In some embodiments, the metal layer is a copper layer.

In some embodiments, the inorganic conductive layer has a stripe structure in a plan view.

In some embodiments, a width of the stripe structure is about 10 μm to about 50 μm.

In some embodiments, a thickness of the inorganic conductive layer is about 0.1 μm to about 1 μm.

In some embodiments, the inorganic conductive layer is arranged at intervals in a cross-sectional view of the at least one contact pad area.

In some embodiments, the inorganic conductive layer has a mesh structure, a branch-like structure, a honeycomb structure, or grille structure.

In some embodiments, the inorganic conductive layer has an area of about 10,000 square microns to about 1,000,000 square microns.

In some embodiments, the at least one contact pad area is a plurality of contact pad areas, and the plurality of contact pad areas are electrically connected through the inorganic conductive layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides a detailed description of many different embodiments, or examples, for implementing different features of the provided subject matter. These are, of course, merely examples and are not intended to limit the invention but to illustrate it. In addition, various embodiments disclosed below may combine or substitute one embodiment with another, and may have additional embodiments in addition to those described below in a beneficial way without further description or explanation. In the following description, many specific details are set forth to provide a more thorough understanding of the present disclosure. It will be apparent, however, to those skilled in the art, that the present disclosure may be practiced without these specific details.

Further, spatially relative terms, such as "beneath," "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

A number of examples are provided herein to elaborate upon the contact area structure of the instant disclosure. However, the examples are for demonstration purpose alone, and the instant disclosure is not limited thereto.

Figure 1:
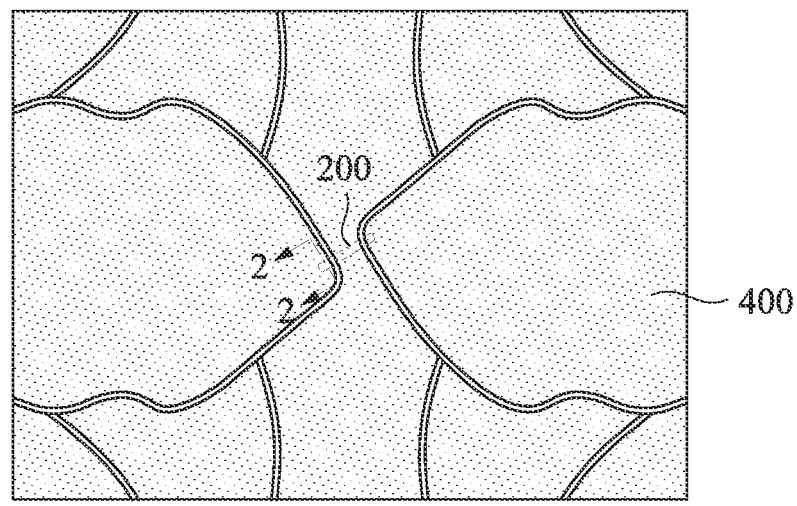
FIG. 1 depicts a schematic diagram of a contact area structure according to a first example of the present disclosure.
Figure 2:
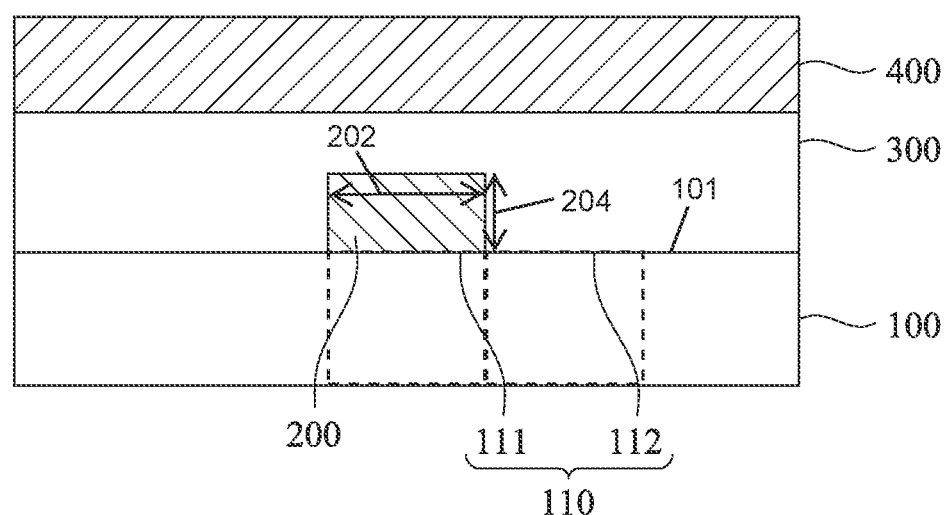
FIG. 2 depicts a partial cross-sectional view of FIG. 1 at line 2-2.

In some embodiments of the present disclosure, please refer to FIG. 1 and FIG. 2. The contact area structure 10 includes an organic substrate 100, an inorganic conductive layer 200, an organic adhesive layer 300, and a transparent conductive layer 400.

In one embodiment, the contact area structure 10 of the present disclosure can be widely used in places where organic materials and inorganic materials are overlapped and contacted, including, but not limited to, the position where a nanosilver contacts a metal layer. For example, contact area structure 10 is an intersection or an overlap of a touch electrode and a signal transmission line in a touch panel, enabling a signal of the touch electrode can be transmitted to the signal transmission line.

In one embodiment, the organic substrate 100 refers to a non-conductive material. The substrate can be rigid or flexible. The substrate can be transparent or opaque. Suitable rigid substrates include, for example, polycarbonate, acrylic, or the like. Suitable flexible substrates include, but are not limited to: polyesters (for example, polyethylene terephthalate (PET), polyethylene naphthalate, and polycarbonate), polyolefins (e.g., linear, branched and cyclic polyolefins), polyethylene (e.g., polyvinyl chloride, polyvinylidene chloride, polyvinyl acetal, polystyrene, polyacrylate, and the like), cellulose ester substrates (e.g., triacetate fiber cellulose and cellulose acetate), polysulfone (e.g. polyethersulfone), polyimide, polysiloxane, and other conventional polymer films. Other examples of suitable substrates can be found in, for example, U.S. Pat. No. 6,975,067.

In one embodiment, the organic substrate 100 includes at least one contact pad area 110, and the contact pad area 110 includes a first block 111 and a second block 112 adjacent to the first block 111. In some examples, the contact pad area 110 has a continuous plane or a block shape.

In one embodiment, the organic substrate 100 includes a plurality of contact pad areas 110. In some examples, the contact pad areas 110 are not connected to each other. In some examples, the contact pad areas 110 are electrically connected via the inorganic conductive layer 200.

In one embodiment, the inorganic conductive layer 200 is disposed on the organic substrate 100, in which the inorganic conductive layer 200 is partially disposed on the first block 111, and a portion of an upper surface of the organic substrate 100 is exposed at the second block 112. In the partial cross-sectional view of FIG. 2, the organic adhesive layer 300 covering the organic substrate 100 is adjacent to both sides of the inorganic conductive layer 200, forming an interval arrangement of organic, inorganic, and organic materials, in which the adhesion of the transparent conductive layer 400 is strongly increased so that the transparent conductive layer 400 is difficult to peel off while photoresist stripping. In one embodiment, the inorganic conductive layer 200 is a metal layer. In some examples, the material of the metal layer includes, but is not limited to, indium tin oxide, silver, zinc, copper, gold, platinum, tungsten, aluminum, or metal alloys of the above metals. In some examples, the inorganic conductive layer 200 can be used as a transmission line. In some examples, the inorganic conductive layer 200 is a portion of a flexible circuit board.

In one embodiment, the organic adhesive layer 300 can help to adhere the transparent conductive layer 400 to the inorganic conductive layer 200 and the organic substrate 100. The organic adhesive layer 300 includes a suitable binder, such as an optically clear polymer including, without limitation: polyacrylics such as polymethacrylates (e.g., poly(methyl methacrylate)), polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g., ethylene propylene rubber (EPR), styrene-butadiene rubber (SBR), and ethylene propylene diene monomer rubber (EPDM)), and fluoropolymers (e.g., polyvinylidene fluoride, polytetrafluoroethylene (TFE), or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co. or Teflon® AF by Du Pont).

In one embodiment, the transparent conductive layer 400 is prepared by coating a coating composition including a nanostructure. To form the coating composition, metal nanowires are usually dispersed in a volatile liquid to aid the coating process. It should be noted that as used herein, any non-corrosive volatile liquid in which metal nanowires can form a stable dispersion can be used. Preferably, the metal nanowires are dispersed in water, alcohol, ketone, ether, hydrocarbon, or aromatic solvent (benzene, toluene, xylene, etc.). More preferably, the liquid is volatile, having a boiling point of no more than 200° C., no more than 150° C., or no more than 100° C.

In addition, a metal nanowire dispersion may include additives and binders to control viscosity, corrosion, adhesion, and nanowire dispersion. Examples of suitable additives and binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., Zonyl® by DuPont).

In some examples, a nanowire dispersion, or "ink" includes, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for HPMC), from 94.5% to 99.0% solvent, and from 0.05% to 1.4% metal nanowires. Representative examples of suitable surfactants include, for example, Zonyl® FSN, Zonyl® FSO, Zonyl® FSH, Triton (x100, x114, x45), Dynol (604, 607), n-Dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, and hydroxy ethyl cellulose. Examples of suitable solvents include water and isopropanol.

The nanowire concentration in the dispersion can affect or determine parameters such as thickness, conductivity (including surface conductivity), optical transparency, and mechanical properties of the nanowire network layer. The percentage of the solvent can be adjusted to provide a desired concentration of the nanowires in the dispersion. In a preferred example, the relative ratios of the other ingredients, however, can remain the same. In particular, the ratio of the surfactant to the viscosity modifier by weight is preferably in the range of about 80 to about 0.01; the ratio of the viscosity modifier to the metal nanowires by weight is preferably in the range of about 5 to about 0.000625; and the ratio of the metal nanowires to the surfactant by weight is preferably in the range of about 560 to about 5. The ratios of components of the dispersion may be modified depending on the substrate and the method of application used. The preferred viscosity range for the nanowire dispersion is between about 1 and 100 cP.

Following the coating, the volatile liquid is removed by evaporation. The evaporation can be accelerated by heating (e.g., baking). The resulting nanowire network layer may require post-treatment to render the resulting nanowire network layer electrically conductive. This post-treatment can be a process step involving exposure to heat, plasma, corona discharge, UV-ozone, or pressure as described below.

In one embodiment, the transparent conductive layer 400 (i.e., a conductive network on a non-conductive substrate) can be quantitatively defined by parameters including light transmission and haze. "Light transmission" (or "light transmissivity") refers to the percentage of an incident light (in the visible range of 400 nm to 700 nm wavelengths) transmitted through a medium. In various examples, the light transmission of the conductive layer is at least 80% and can be as high as 98%. Performance-enhancing layers, such as an adhesive layer, anti-reflective layer, or anti-glare layer, may further contribute to reducing the overall light transmission of the transparent conductor. In various examples, the light transmission (T %) of the transparent conductors can be at least 50%, at least 60%, at least 70%, or at least 80% and may be as high as at least 91% to 92%, or at least 95%.

The organic substrate 100, the inorganic conductive layer 200, the organic adhesive layer 300, and the transparent conductive layer 400 are described in more detail in the following non-limiting examples.

Example 1

FIG. 1 depicts a schematic diagram of the contact area structure according to the first example of the present disclosure, and FIG. 2 depicts a partial cross-sectional view of FIG. 1 at line 2-2. The contact area structure 10 of an embodiment of the present disclosure includes the organic substrate 100, the inorganic conductive layer 200, the organic adhesive layer 300, and the transparent conductive layer 400.

The organic substrate 100 includes at least one contact pad area 110, and the contact pad area 110 includes a first block 111 and a second block 112 adjacent to the first block 111.

The inorganic conductive layer 200 is disposed on the organic substrate 100, and the inorganic conductive layer 200 is partially disposed on the first block 111, and a portion of an upper surface of the organic substrate 100 is exposed at the second block 112. The inorganic conductive layer 200 is a metal layer, such as a copper layer. The inorganic conductive layer 200 has a stripe structure in the plan view, and a width 202 of the stripe structure is about 10 μm to 50 μm, for example: about 15 μm, about 20 μm, about 25 μm, about 30 μm, about 35 μm, about 40 μm, about 45 μm, or any value between any two of these values. A thickness 204 of the inorganic conductive layer 200 is about 0.1 μm to 1 μm, for example: about 0.2 μm, about 0.3 μm, about 0.4 μm, about 0.5 μm, about 0.6 μm, about 0.7 μm, about 0.8 μm, about 0.9 μm, or any value between any two of the values. An area of the inorganic conductive layer 200 is about 10,000 square microns ($\mu m^2$) to about 1,000,000 square microns, for example: about 50,000 square microns, about 100,000 square microns, about 200,000 square microns, about 500,000 square microns, about 700,000 square microns, about 900,000 square microns, or the equivalent any value between any two of the values will help the adhesion between the transparent conductive layer 400 and the inorganic conductive layer 200.

The organic adhesive layer 300 covers the inorganic conductive layer 200 and the upper surface 101 of the organic substrate 100. In other words, the organic substrate 100 is covered by the inorganic conductive layer 200 and a portion of the organic adhesive layer 300.

The transparent conductive layer 400 is disposed on the organic adhesive layer 300. The transparent conductive layer 400 includes nano silver. By covering the organic substrate 100 with the inorganic conductive layer 200 and the portion of the organic adhesive layer 300, the transparent conductive layer 400 has strong adhesion and is difficult to peel off when photoresist stripping.

Example 2

Figure 3:
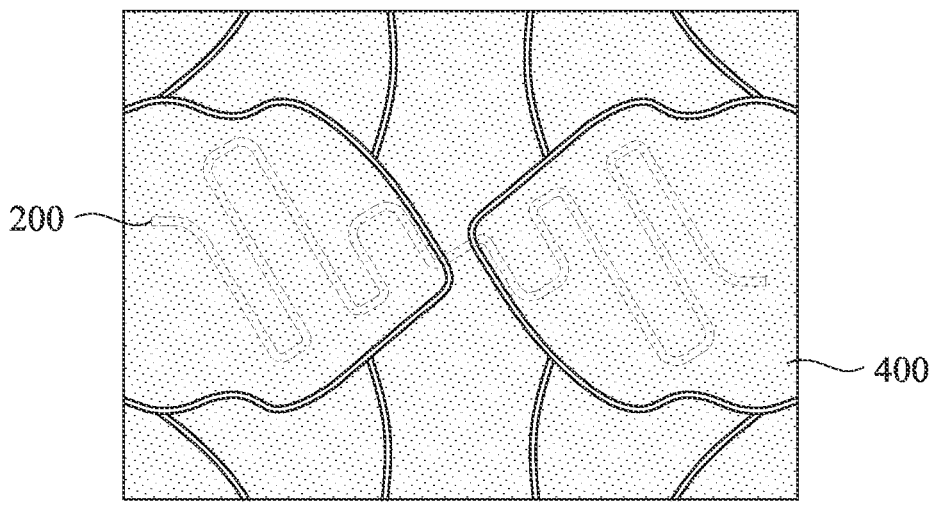
FIG. 3 depicts a schematic diagram of the contact area structure according to a second example of the present disclosure.

FIG. 3 depicts a schematic diagram of the contact area structure 10 according to the second example of the present disclosure. The difference between the second example and the first example is that the pattern of the inorganic conductive layer 200 in the second embodiment has a curved stripe structure in the plan view. In a partial cross-sectional view, similar to the FIG. 2, the organic adhesive layer 300 covering the organic substrate 100 is adjacent to both sides of the inorganic conductive layer 200, so that the transparent conductive layer 400 has strong adhesion and is difficult to peel off when photoresist stripping.

Example 3

Figure 4:
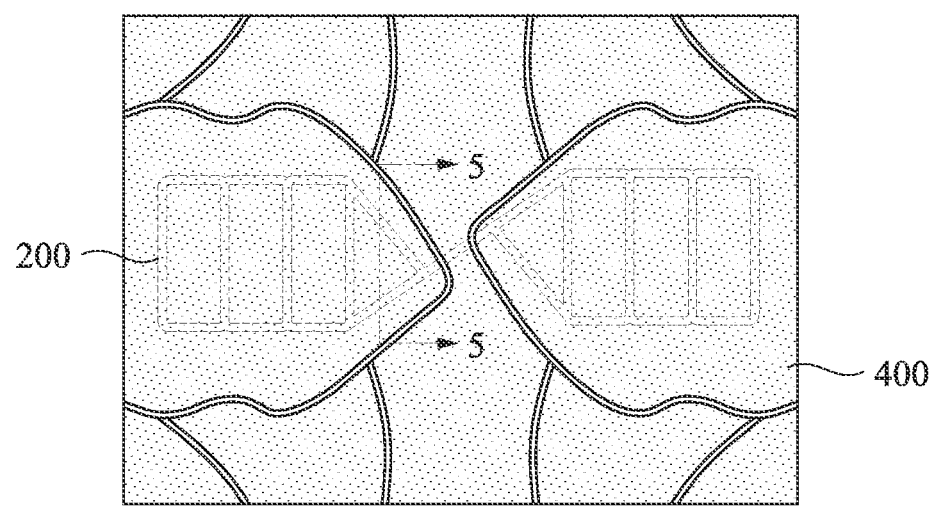
FIG. 4 depicts a schematic diagram of the contact area structure according to a third example of the present disclosure.
Figure 5:
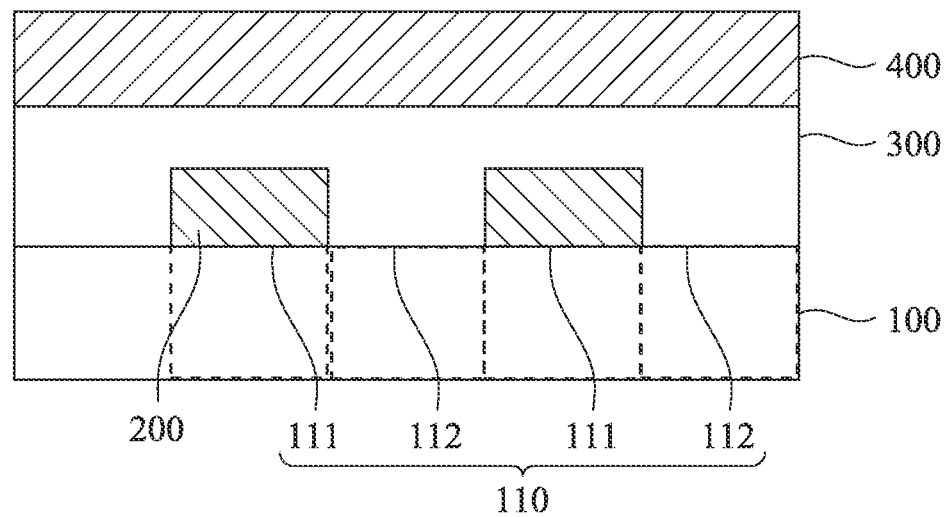
FIG. 5 depicts a partial cross-sectional view of FIG. 4 at line 5-5.

FIG. 4 depicts a schematic diagram of the contact area structure 10 according to a third example of the present disclosure, and FIG. 5 depicts a partial cross-sectional view of FIG. 4 at line 5-5. The difference between the third example and the first example is that the inorganic conductive layer 200 is arranged at intervals in the cross-sectional view of the contact pad area 110, and the contact pad area 110 has a plurality of first blocks 111 and a plurality of second blocks 112. In detail, the inorganic conductive layer 200 has a grille structure, empty spaces of the inorganic conductive layer 200 are over the second blocks 112, and the upper surface of the organic substrate 100 is exposed. In the partial cross-sectional view of FIG. 5, the organic adhesive layer 300 covering the organic substrate 100 is adjacent to both sides of the inorganic conductive layer 200 to form an interval arrangement of organic, inorganic, organic, inorganic, and organic materials, in which the adhesion of the transparent conductive layer 400 is strongly increased so that the transparent conductive layer 400 is difficult to peel off while photoresist stripping.

Example 4

Figure 6:
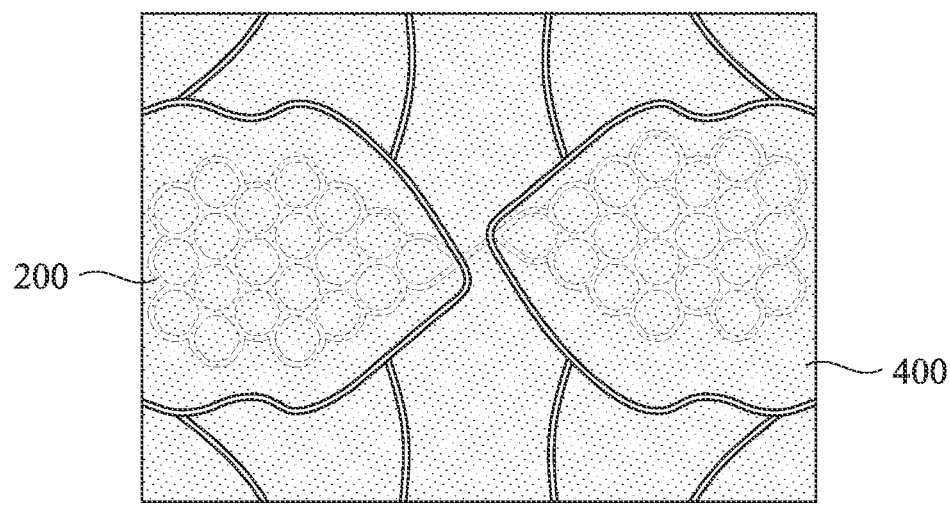
FIG. 6 depicts a schematic diagram of the contact area structure according to a fourth example of the present disclosure.

FIG. 6 depicts a schematic diagram of the contact area structure 10 according to the fourth example of the present disclosure. The difference between the fourth example and the third example is that the inorganic conductive layer 200 has a honeycomb structure in the cross-sectional view of the contact pad area 110. In the partial cross-sectional view, similar to FIG. 5, the organic adhesive layer 300 covering the organic substrate 100 is adjacent to both sides of the inorganic conductive layer 200, forming an interval arrangement of organic, inorganic, organic, inorganic, and organic materials, in which the adhesion of the transparent conductive layer 400 is strongly increased so that the transparent conductive layer 400 is difficult to peel off while photoresist stripping.

The organic adhesive layer 300 and the organic substrate 100, which are both organic materials, are chemically bonded to each other, which have stronger adhesion than the van der Waals force bonding of the inorganic conductive layer 200 and the organic substrate 100. Therefore, in an embodiment of the present disclosure, the adhesion force of the transparent conductive layer 400 to the inorganic conductive layer 200 is significantly enhanced, so as to avoid peeling off because of the photoresist stripping.

One embodiment of the present disclosure is to cut a traditional whole piece of continuous nanosilver and metal layer in the contact pad area into small special-shaped contacts. After the metal layer in the contact pad area is partially empty, the nanosilver adhesive with good adhesion can be adhered to the organic substrate. At the same time, the metal layer with poor adhesion is adhered by the adhesive on both sides. In some embodiments, because of the material properties of nanosilver, the nanosilver and the emptying of the metal layer in the contact pad area will not cause the contact area to increase proportionally to the resistance.

While the disclosure has been described by way of example(s) and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A contact area structure, comprising:
    an organic substrate comprising at least one contact pad area, the at least one contact pad area comprising a first block and a second block adjacent to the first block;
    an inorganic conductive layer disposed on the organic substrate, wherein the inorganic conductive layer is partially disposed on the first block, and a portion of an upper surface of the organic substrate is exposed at the second block;
    an organic adhesive layer covering the inorganic conductive layer and the upper surface of the organic substrate; and
    a transparent conductive layer disposed on the organic adhesive layer, wherein the inorganic conductive layer and the transparent conductive layer have different material compositions, the transparent conductive layer comprises a first portion and a second portion, the inorganic conductive layer defines a structure extending between the first portion and the second portion, and a first end of the structure underlies the first portion and a second end of the structure underlies the second portion.

2. The contact area structure of claim 1, wherein the inorganic conductive layer is a metal layer.

3. The contact area structure of claim 2, wherein the metal layer is a copper layer.

4. The contact area structure of claim 1, wherein the inorganic conductive layer has a stripe structure in a plan view.

5. The contact area structure of claim 4, wherein a width of the stripe structure is about 10 µm to about 50 µm.

6. The contact area structure of claim 4, wherein a thickness of the inorganic conductive layer is about 0.1 µm to about 1 µm.

7. The contact area structure of claim 1, wherein the inorganic conductive layer is arranged at intervals in a cross-sectional view of the at least one contact pad area.

8. The contact area structure of claim 7, wherein the inorganic conductive layer has a mesh structure, a branch-like structure, a honeycomb structure, or grille structure.

9. The contact area structure of claim 1, wherein the inorganic conductive layer has an area of about 10,000 square microns to about 1,000,000 square microns.

10. The contact area structure of claim 1, wherein the at least one contact pad area is a plurality of contact pad areas, and the plurality of contact pad areas are electrically connected through the inorganic conductive layer.

11. The contact area structure of claim 1, wherein the inorganic conductive layer is non-transparent.

12. The contact area structure of claim 1, wherein the structure comprises a first segment underlying the first portion of the transparent conductive layer and a second segment underlying the first portion of the transparent conductive layer, and the second segment extends parallel to the first segment.

13. The contact area structure of claim 12, wherein the structure comprises a third segment underlying the first portion of the transparent conductive layer, and the third segment couples the first segment to the second segment.

14. The contact area structure of claim 13, wherein the structure comprises a fourth segment underlying the first portion of the transparent conductive layer, the fourth segment extends parallel to the third segment, and the fourth segment couples the first segment to the second segment.

15. The contact area structure of claim 1, wherein the structure defines a first opening and a second opening underlying the first portion of the transparent conductive layer, and the organic adhesive layer is present in the first opening and the second opening.

* * * * *